(12) United States Patent
Di et al.

(10) Patent No.: US 11,921,174 B1
(45) Date of Patent: Mar. 5, 2024

(54) METHOD FOR IDENTIFYING IRREVERSIBLE DEMAGNETIZATION OF GRAIN BOUNDARY DIFFUSION NDFEB MAGNET

(71) Applicants: Hangzhou Magmax Technology Co., Ltd., Zhejiang (CN); Hangzhou Foresee Group Holding Co., Ltd., Zhejiang (CN)

(72) Inventors: Jinghui Di, Zhejiang (CN); Huiqiang Liu, Zhejiang (CN); Xiongfei Wu, Zhejiang (CN); Shengli Jia, Zhejiang (CN); Hui Meng, Zhejiang (CN); Qifeng Wei, Zhejiang (CN)

(73) Assignees: Hangzhou Magmax Technology Co., Ltd., Hangzhou (CN); Hangzhou Foresee Group Holding Co., Ltd., Hangzhou (CN)

( * ) Notice: Subject to any disclaimer, the term of this patent is extended or adjusted under 35 U.S.C. 154(b) by 0 days.

(21) Appl. No.: 18/220,392

(22) Filed: Jul. 11, 2023

(30) Foreign Application Priority Data

Nov. 17, 2022 (CN) .......................... 202211458259.1

(51) Int. Cl.
*G01R 33/12* (2006.01)
*H01F 1/057* (2006.01)

(52) U.S. Cl.
CPC ....... *G01R 33/1215* (2013.01); *H01F 1/0571* (2013.01)

(58) Field of Classification Search
CPC .......................... G01R 33/1215; H01F 1/0571
USPC ......................................................... 324/205
See application file for complete search history.

(56) References Cited

U.S. PATENT DOCUMENTS 6,201,386 B1 * 3/2001 Jones ..................... G01R 33/12
324/205
2011/0260748 A1 * 10/2011 Lee ....................... H02P 25/024
324/765.01

FOREIGN PATENT DOCUMENTS

| CN | 102866367 A | * | 1/2013 | |
|---|---|---|---|---|
| CN | 107918107 A | * | 4/2018 | ........... G01R 31/34 |
| CN | 110501640 A | * | 11/2019 | ........... G01R 31/343 |
| CN | 111413616 B | * | 3/2022 | ........... G01R 31/343 |

\* cited by examiner

*Primary Examiner* — Tung X Nguyen
*Assistant Examiner* — Robert P Alejnikov, Jr.
(74) *Attorney, Agent, or Firm* — Cooper Legal Group, LLC

(57) ABSTRACT

The present application relates to a technical field of determining an irreversible demagnetization of a grain boundary diffusion NdFeB magnet, and more particularly, to a method for identifying an irreversible demagnetization of a grain boundary diffusion NdFeB magnet by magnetic field distribution. After applying a reverse magnetic field to a saturatedly magnetized grain boundary diffusion NdFeB magnet, if a number of magnetic poles on a non-diffusion face of the grain boundary diffusion NdFeB magnet is increased, it is determined that there is an irreversible demagnetization in the grain boundary diffusion NdFeB magnet.

13 Claims, 9 Drawing Sheets

METHOD FOR IDENTIFYING IRREVERSIBLE DEMAGNETIZATION OF GRAIN BOUNDARY DIFFUSION NDFEB MAGNET

CROSS-REFERENCE TO RELATED APPLICATION

The present application is based on and claims the priority of Chinese application No. 202211458259.1, filed on Nov. 17, 2022. The entirety of Chinese application No. 202211458259.1 is hereby incorporated by reference herein and made a part of this specification.

TECHNICAL FIELD

The present application relates to a technical field of determining an irreversible demagnetization of a grain boundary diffusion NdFeB magnet, and more particularly, to a method for identifying an irreversible demagnetization of a grain boundary diffusion NdFeB magnet.

BACKGROUND ART

A permanent magnet material is an important energy storage material, and a lot of energy translation devices, such as a loudspeaker, a vibration motor, a driving motor, etc., should rely on the rare earth permanent magnet material.

However, a magnetization state of a grain boundary diffusion product is easily affected by a thickness of itself, especially for a grain boundary diffusion NdFeB magnet, due to complex inner structure of the rare earth permanent magnet material, which in turn affects the performance of the permanent magnet material. Generally, an inner coercivity of the grain boundary diffusion NdFeB magnet is higher than a surface coercivity thereof. However, it is difficult at present to evaluate or judge the inner demagnetization state of the grain boundary diffusion product.

A common method at present for determining the demagnetization state of the magnet is to cut the rare earth permanent magnet material into a plurality of layers, and detect and analyse the coercivity of each of the layers. Although a detection result of each layer of the rare earth permanent magnet material may be obtained by such a method, the method has defects as follow:
(1) the detection has to be conducted by many times, leading to low detection efficiency, since the sample to be detected has a small size;
(2) the magnet is damaged without taking into consideration effect of a large casing of the product, leading to inaccurate analysis result and incapable further use of the magnet; and
(3) such detection entails the use of a large equipment such as VSM, PPMS, MPMS, etc., leading to high resource consumption.

Therefore, there is a need for a detection and evaluation method for judging whether there is demagnetization in rare earth permanent magnet material and whether the material meets specific requirements, without breaking up the grain boundary diffusion NdFeB magnet.

SUMMARY

In order to solve a problem of precisely evaluate whether there is an irreversible demagnetization in a grain boundary diffusion NdFeB magnet, the present application provides a method for identifying an irreversible demagnetization of the grain boundary diffusion NdFeB magnet by magnetic field distribution.

A method for identifying an irreversible demagnetization of grain boundary diffusion NdFeB magnet includes applying a reverse magnetic field to a saturation-magnetization grain boundary diffusion NdFeB magnet, and, if a number of magnetic poles on a non-diffusion face of the grain boundary diffusion NdFeB magnet is increased and divided into layers, determining that there is an irreversible demagnetization in the grain boundary diffusion NdFeB magnet.

In the above technical solution, a sample of the present application is grain boundary diffusion NdFeB magnet, a face of the magnet is coated with a heavy rare earth material, and the heavy rare earth material enters a grain boundary of the magnet, so that the NdFeB magnet has a higher coercivity.

The above "diffusion face" is a face of the NdFeB magnet coated with the heavy rare earth material, and, generally, there are two of the faces. A "non-diffusion face" is an other face than the diffusion face.

When the grain boundary diffusion NdFeB magnet is applied with the reserve magnetic field, if the increase of the number of the magnetic poles of the non-diffusion face are observed by a machine, it is proved that there is the irreversible demagnetization in the grain boundary diffusion NdFeB magnet.

The method of the present application is not easily affected by a size or a temperature of the grain boundary diffusion NdFeB magnet. A shape of the magnet is usually cylindrical in operation. By the method according to the present application, the integrity of the grain boundary diffusion NdFeB magnet and subsequent application thereof will not be easily influenced.

In some embodiments, the operation step includes:
saturatedly magnetizing the grain boundary diffusion NdFeB magnet, applying the reverse magnetic field, and analyzing a value of the reverse magnetic field, the number of the magnetic poles and distribution of the magnetic poles in the reverse magnetic field.

In the above technical solution, saturatedly magnetizing the grain boundary diffusion NdFeB provides the grain boundary diffusion NdFeB with magnetism and the grain boundary diffusion NdFeB does not easily suffer from demagnetization during saturated magnetization.

In some embodiments, if a diffusion direction is parallel to an orientation direction of the grain boundary diffusion NdFeB magnet, and the number of the magnetic poles appearing on a non-orientation face is increased and divided into layers, it is determined that there is an irreversible demagnetization in the grain boundary diffusion NdFeB magnet.

In some embodiments, if a diffusion direction is perpendicular to an orientation of the grain boundary diffusion NdFeB magnet, and the number of the magnetic poles appearing on an orientation surface is increased and divided into layers, it is determined that there is an irreversible demagnetization in the grain boundary diffusion NdFeB magnet.

In the present application, a direction of the applied reserve magnetic field is an orientation direction, a face corresponding to the grain boundary magnet is an orientation face and the other faces are non-orientation faces.

However, no matter whether the orientation direction is parallel to the diffusion direction or perpendicular to the diffusion direction, an eventual state is determined by a state shown from the non-diffusion face.

In some embodiments, if a diffusion direction is parallel to an orientation direction of the grain boundary diffusion NdFeB magnet, and the number of the magnetic poles appearing on a non-orientation surface is increased and divided into layers, there is an alternative magnetic pole distribution N/S/N/S.

In some embodiments, a heavy rare earth element is coated on the orientation surface of the grain boundary diffusion NdFeB magnet, wherein the orientation surface is one selected from a group consisting of N pole face and S pole face of the grain boundary diffusion NdFeB magnet.

In some embodiments, if the diffusion direction is parallel to an orientation direction of the grain boundary diffusion NdFeB magnet, and the number of the magnetic poles appearing on a non-orientation surface is increased and divided into layers, there is an alternative magnetic pole distribution N/S/N or S/N/S.

In some embodiments, a heavy rare earth element is coated on the non-orientation surface of the grain boundary diffusion NdFeB magnet, wherein the non-orientation surface is one of a group of parallel faces other than the N pole face and the S pole face of the grain boundary diffusion NdFeB magnet.

In the above technical solution, the diffusion directions are two opposite directions between the two diffusion faces of the magnetic surfaces coated with the heavy rare earth material, the applied reserve magnetic field direction is the orientation direction, the orientation face is a face corresponding to the orientation direction, and the non-orientation face is a face other than the orientation face.

When the diffusion direction is parallel to the orientation direction of the magnet, the non-orientation face is the non-diffusion face; and when the diffusion direction is perpendicular to the orientation direction of the magnet, the orientation face is the non-diffusion face.

When the diffusion direction is parallel or perpendicular to the orientation direction, there will be different distribution of magnetic poles, but the number of the magnetic poles is not less than two.

In some embodiments, a device used for identifying a magnetic field distribution characteristic can be any one selected from a group consisting of a magnetic field distribution visualization device, a spatial magnetic field distribution measuring instrument, a Gauss meter, a magnetic developing film and a magnetic-pole identifying pen.

The number of the magnetic poles and the distribution of layers of the magnetic poles and can be observed by adopting the method of the present application using any one of the above devices, which, however, is not limited thereto. The detection results obtained by using the above devices may be compared to each other to confirm whether there is an irreversible demagnetization in the grain boundary diffusion NdFeB magnet.

In some embodiments, a temperature of the saturation-magnetization grain boundary diffusion NdFeB magnet is no less than 20° C.; and a size of the grain boundary diffusion NdFeB magnet along a diffusion orientation is no greater than 12 mm.

In the present application, a grain boundary diffusion NdFeB magnet, even with a higher temperature during the using process, may be directly detected, which increases the applicable range of the detection. A biggest distance between two faces coated with rare earth materials may be 12 mm, which reduces a size requirement for the grain boundary diffusion magnet to be detected.

In some embodiments, a value of the reverse magnetic field applied on the grain boundary diffusion NdFeB magnet is less than a coercivity of the grain boundary diffusion NdFeB magnet.

It is found that, the value of the reserve magnetic field applied on the surface of the grain boundary diffusion magnet to be detected is less than the coercivity of the grain boundary diffusion NdFeB magnet, which provides a reference and a primary limitation to the value of the reserve magnetic field applied during the detection, rendering the detection convenient.

In summary, the present application may achieve beneficial effects as follows:

1. By adopting the method of the present application, it is only needed to saturatedly magnetize the grain boundary diffusion magnet, apply the reserve magnetic field, and control the value of the magnetic field. When the value of the reserve magnetic field reach a given value, a conclusion on whether there is the demagnetization in the grain boundary diffusion NdFeB magnet can be obtained. The method of the present application is achieved a high accuracy and causes no damage to the whole body of the grain boundary diffusion NdFeB magnet, so that the magnet may be still used in a relative art if there is no demagnetization phenomenon upon detection;

2, In the method of the present application, when the direction of the applied reserve magnetic field (the orientation direction) is parallel to the diffusion direction of the rare earth material, the number of the magnetic poles on the non-orientation face (non-diffusion face) of the magnet are increased, and there is an alternative magnetic pole distribution N/S/N/S; and when the direction of the applied reserve magnetic field (the orientation direction) is perpendicular to the diffusion direction of the rare earth material, the number of the magnetic poles on the orientation face of the magnet are increased, and there is an alternative magnetic pole distribution N/S/N or S/N/S.

3, The method of the present application is easy and effective to operate, and there is no limitation to the size of the grain boundary diffusion NdFeB magnet to be detected, which may be adjusted according to actual needs, as long as a dimension along a diffusion direction of the grain boundary diffusion NdFeB magnet is not larger than 12 mm; merely a cylindrical shape of the magnet can meet the requirement; and the detection result can be obtained when the devices are adhered to a surface of the magnet or located within 2 mm from the surface of the magnet.

DETAILED DESCRIPTION

A detailed information of samples in Examples and Comparative Examples are shown in Table 1.

TABLE 1

Parameters of the samples used in Examples and Comparative Examples.

| Example | Sample | Specification | Size along orientation direction (mm) | Model | Type of magnets | Thickness of rare earth material coating (μm) | Diffusion process | Br/ kGs | Hcj/ kOe | Relationship between orientation direction and diffusion direction |
|---|---|---|---|---|---|---|---|---|---|---|
| Example 1 | Sample 1 | 20 × 15 × 4M | 4 | N56SH | Grain boundary diffusion | 13 | 900° C. × 16 h + 500° C. × 4 h | 14.72 | 22.62 | Parallel |
| Example 2 | Sample 2 | 20 × 15 × 6M | 6 | N56SH | Grain boundary diffusion | 13 | 900° C. × 16 h + 500° C. × 5 h | 14.74 | 21.58 | Parallel |
| Example 3 | Sample 3 | 20 × 15 M × 6 | 15 | N56SH | Grain boundary diffusion | 13 | 900° C. × 16 h + 500° C. × 5 h | 14.79 | 22.08 | Perpendicular |
| Example 6 | Sample 4 | 20 × 15 M × 6 | 15 | N38ZH | Grain boundary diffusion | 13 | 900° C. × 16 h + 500° C. × 4 h | 12.52 | 45.10 | Perpendicular |
| Example 7 | Sample 5 | 20 × 15 M × 10 | 15 | N48UH | Grain boundary diffusion | 30 | 900° C. × 30 h + 500° C. × 4 h | 13.79 | 28.16 | Perpendicular |
| Comparative Example 1 | Sample 6 | 20 × 15 × 6M | 6 | N52SH | Non-grain boundary diffusion | — | — | 14.32 | 19.03 | Parallel |

EXAMPLES

Example 1 is a method for identifying an irreversible demagnetization of a grain boundary diffusion NdFeB magnet, in which Sample 1 was used, having a size of 20*15*4 mm, and relative parameters shown in Table 1.

Figure 1:
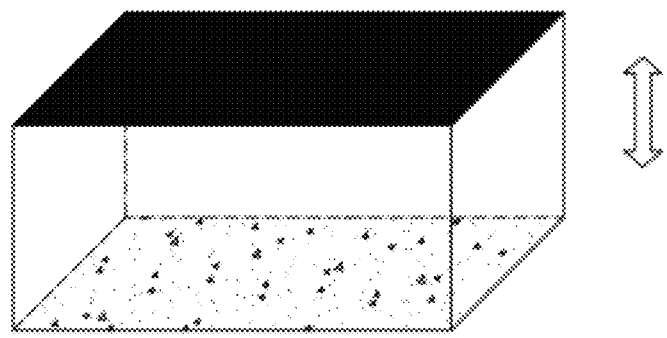
FIG. 1 is a schematic illustration of an orientation direction and a coated face of a magnet of Sample 1 (a grain boundary diffusion NdFeB magnet) in Example 1.
Figure 2:
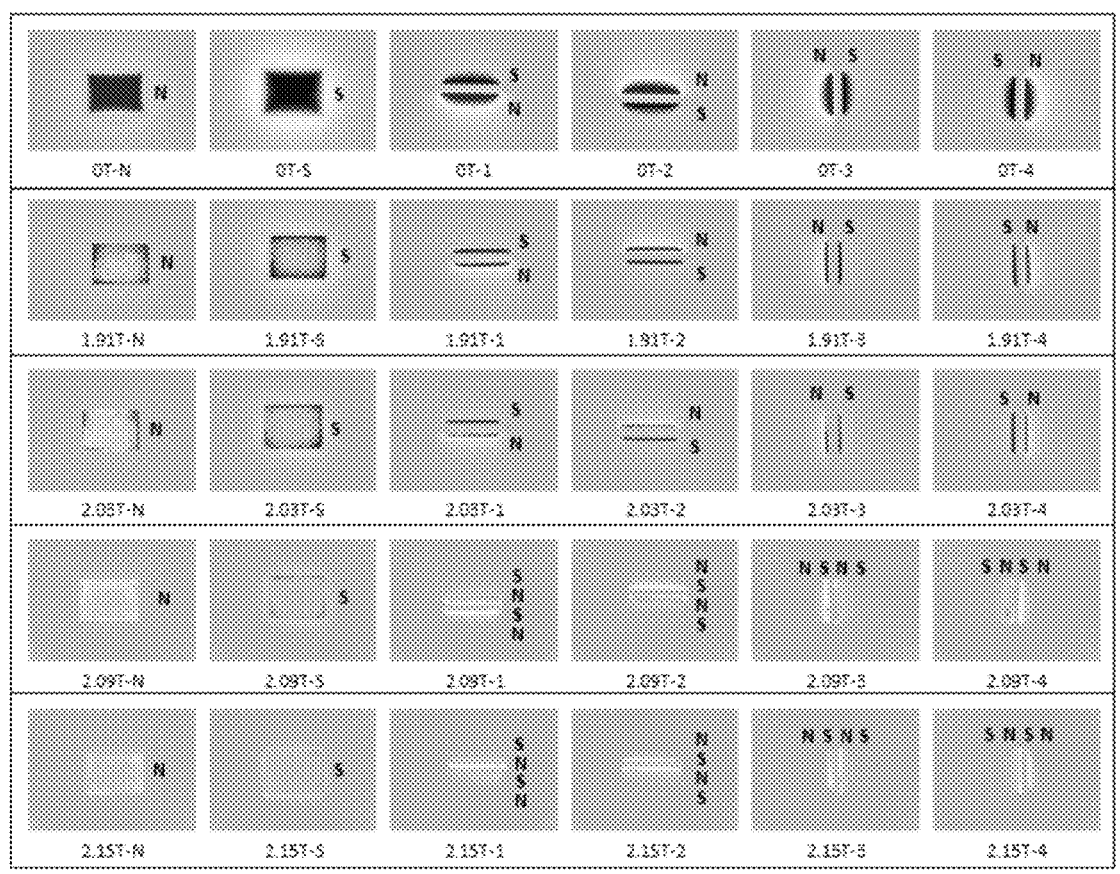
FIG. 2 is an image of magnetic field distribution of Sample 1 in Example 1 obtained when being applied with reserve magnet fields having different intensities.

Particular steps include:
1) Selecting a grain boundary diffusion Sample 1, in which a size of an orientation face (i.e a diffusion face coated with heavy rare earth, including an upper surface and a lower surface of Sample 1) is 20*15 mm, a size along an orientation direction (i.e an arrow direction, a direction for applying a reserve magnetic field, being the same as a diffusion direction) is 4 mm, as shown in FIG. 1 in details;
2) Saturatedly magnetizing Sample 1, placing on a magnetic field distribution visualization device (Magview™), and observing a magnetic field distribution characteristics of each of the faces under saturation magnetization;
3) Applying a reserve magnetic field having an intensity of 1.91 T and opposite to a direction for saturated magnetization toward Sample 1, and placing Sample 1 on a detection window of Magview™ to observe magnetic field distribution characteristics of each of the faces of Sample 1 under this state;
4) Saturatedly magnetizing Sample 1 for a second time, applying a reserve magnet in having an intensity of 2.03 T, and observing the magnetic field distribution characteristics of Sample 1 under this state;
5) Repeating the step 4) by applying a reserve magnetic field having an intensity of 2.09 T; repeating again the step 4) by applying a reserve magnetic field having an intensity of 2.15 T for a second time; and observing the magnetic field distribution characteristics of Sample 1 after the two operations; and
6) Summarizing all the magnetic field distribution characteristics of Sample 1 in FIG. 2.

Pictures obtained when applying no reverse magnetic field or a reverse magnetic field having an intensity of 1.91 T, 2.03 T, 2.09 T and 2.15 T are shown in FIG. 2, in which N in a first column and S in a second column respectively correspond to images of orientation faces (diffusion faces, including a top face and a bottom face), and side 1-side 4 respectively correspond to the images of non-diffusion faces, in which a third column and a forth column respectively correspond to the images of two opposite faces, that is, side1-side2 (a front face and a back face), and a fifth column and a sixth column correspond to the images of two opposite faces, that is, side3-side4 (a left face and a right face).

It can be seen from FIG. 2 that, both number and distribution of magnetic poles in the images of four faces, that is, side1-side4, are changed significantly when the intensity of the reserve magnetic field is 2.09 T; and, furthermore, both number and distribution of magnetic poles in the images of the four faces are changed more significantly when the intensity of the reserve magnetic field is 2.15 T. The above phenomenon shows that, Sample 1 has suffered from an irreversible demagnetization when the intensity of the reserve magnetic field is 2.09 T, which is smaller than a coercivity of Sample 1.

Example 2 is a method for identifying an irreversible demagnetization of a grain boundary diffusion NdFeB magnet, differing from Example 1 in that: it used Sample 2 having an average remanence of 14.74 kGs, an average coercivity of 21.58 kOe, and other parameters shown in Table 1.

Figure 3:
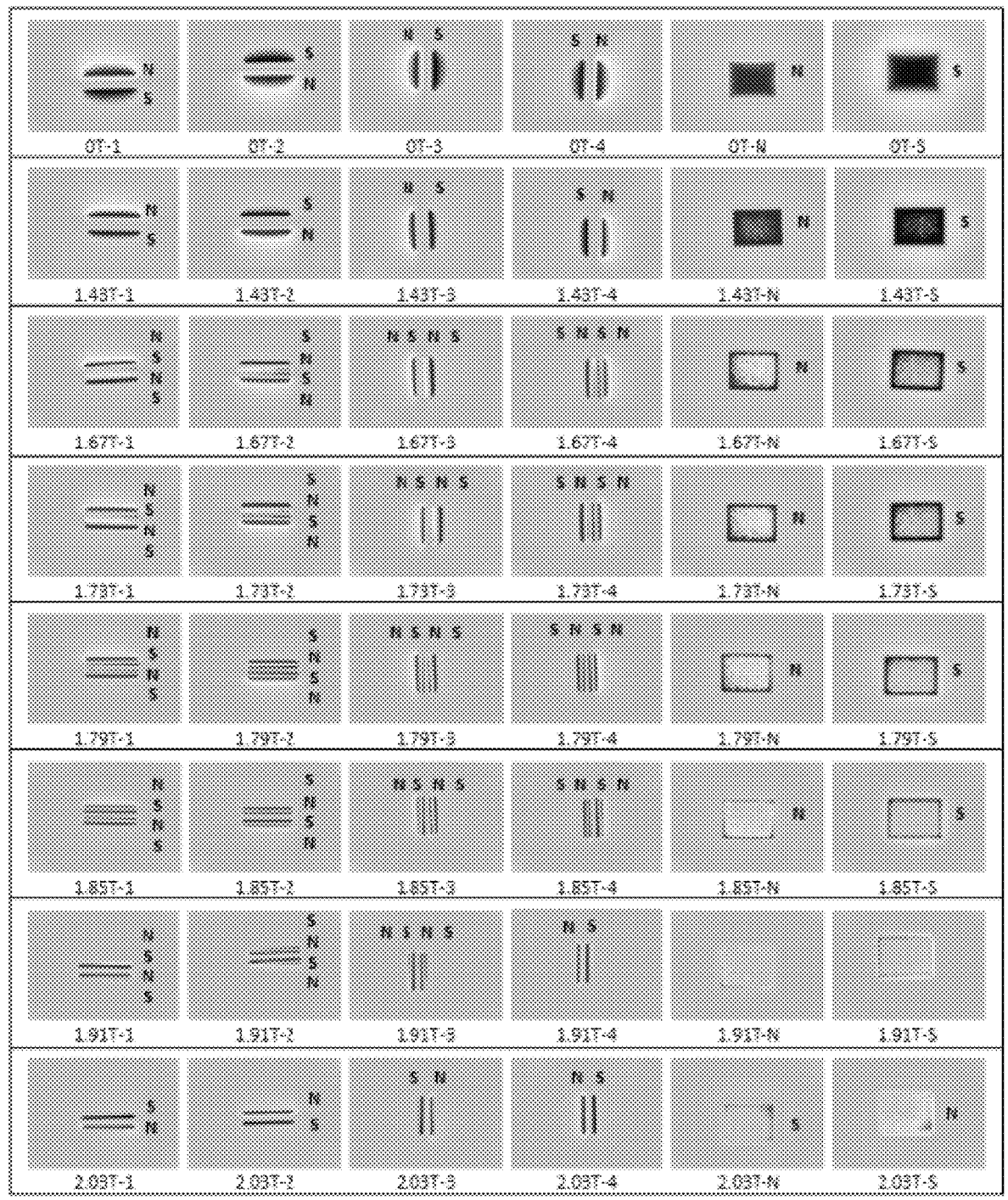
FIG. 3 is an image of magnetic field distribution of Sample 2 in Example 2 obtained when being applied with reserve magnet fields having different intensities.

Particular operation steps include:
1) selecting a grain boundary diffusion Sample 2 having a size of 20*15*6 mm, a size of an orientation face (i.e., a diffusion face coated with heavy rare earth, which is parallel to an orientation direction) of 20*15 mm, and a size along the orientation direction of 6 mm;
2) saturatedly magnetizing Sample 2, and observing magnetic field distribution characteristics of each of the faces under saturated magnetization at a detection window of Magview™;
3) applying a reserve magnetic field opposite to a direction for saturated magnetization to Sample 2, in which an intensity of the reserve magnetic field is 1.43 T, and observing magnetic field distribution characteristics of each of the faces of Sample 2 by the method in step 2);
4) saturatedly magnetizing Sample 2, applying the reserve magnetic field thereto for a second time, in which the intensity of the reserve magnetic field is 1.67 T, and observing the magnetic field distribution of Sample 2 by the method in step 2);
5) repeating step 4), in which the intensity of the reserve magnetic fields is 1.73 T, 1.79 T, 1.85 T and 2.03 T respectively; and observing the magnetic field distribution characteristics of Sample 2 after each of the operations; and
6) Summarizing all the magnetic field distribution characteristics of Sample 2 in FIG. 3.

FIG. 3 shows images obtained when applying no reverse magnetic field or applying a reverse magnetic field having an intensity of 1.43 T, 1.67 T, 1.73 T, 1.79 T, 1.85 T, 1.91 T and 2.03 T, respectively, in which the side1-side4 in a first column to a forth column respectively correspond to the images of the non-diffusion faces, and N in a fifth column and S in a sixth column respectively correspond to the images of diffusion faces. In particular, the first column and the second column respectively correspond to the images of two opposite faces, that is, side1-side2 (front face and back face), and the third column and the forth column correspond to the images of two opposite faces, that is, side3-side4 (left face and right face).

It can be seen from FIG. 3 that, when the intensity of the reserve magnetic field is 1.67 T, the number and distribution of magnetic poles are changed significantly in the images of side1-side4 four faces; and, furthermore, when the intensity of the reserve magnetic field is 1.73 T, the number and distribution of the magnetic poles are further changed significantly in the images of side1-side4 four faces. The above phenomenon shows that, Sample 2 has suffered from an irreversible demagnetization when the reserve magnetic field having an intensity of 1.67 T is applied.

Example 3 is a method for identifying an irreversible demagnetization of a grain boundary diffusion NdFeB magnet, differing from Example 1 by using Sample 3 having an average magnetic field intensity of 14.79 kGs, an average coercivity of 22.08 kOe, and other parameters shown in Table 1.

Figure 4:
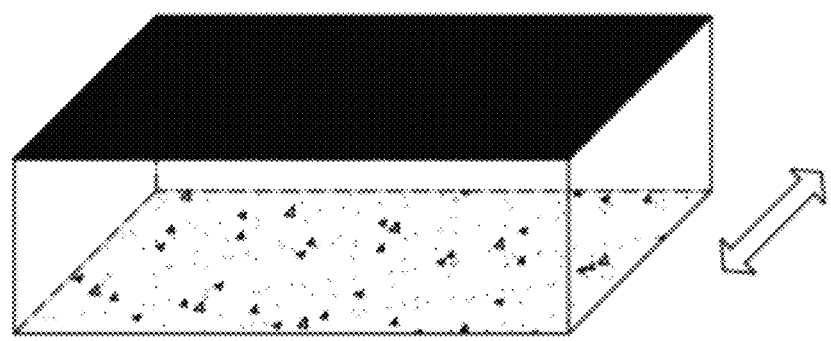
FIG. 4 is a schematic illustration of an orientation direction and a coated face of a magnet of Sample 3 in the Example 1.
Figure 5:
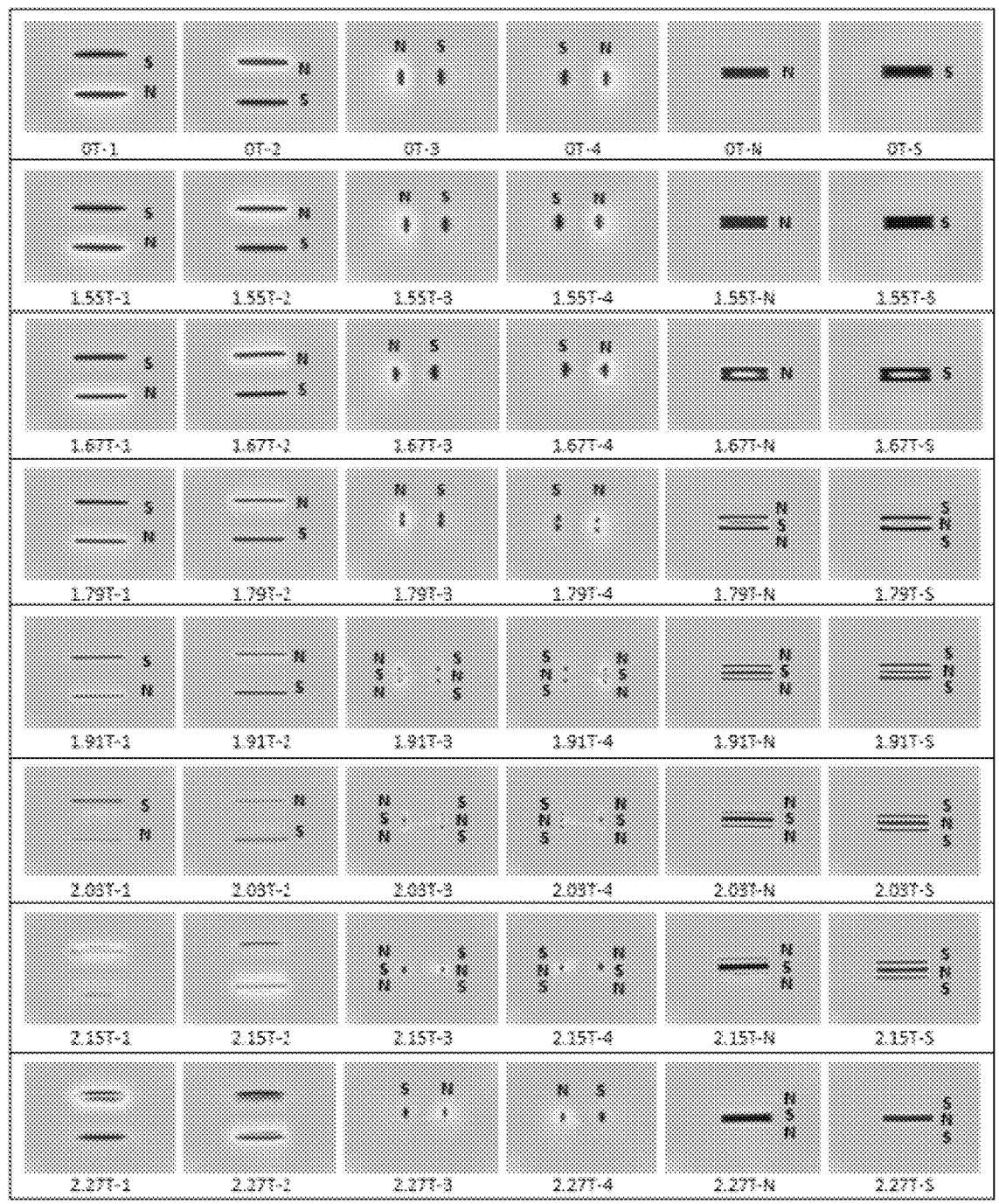
FIG. 5 is an image of magnetic field distribution of Sample 3 in Example 3 obtained when being applied with reserve magnet fields having different intensities.
Figure 6:
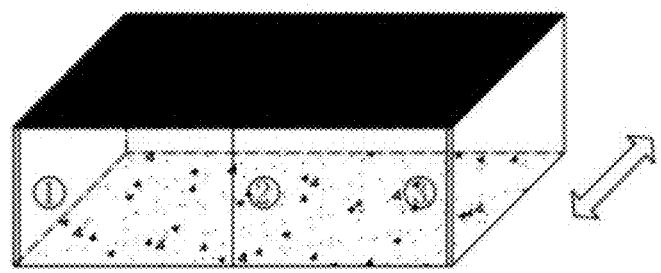
FIG. 6 is a schematic illustration of Sample 3, three linear-scanning marker lines and an orientation direction of a reserve magnetic field.
Figure 7:
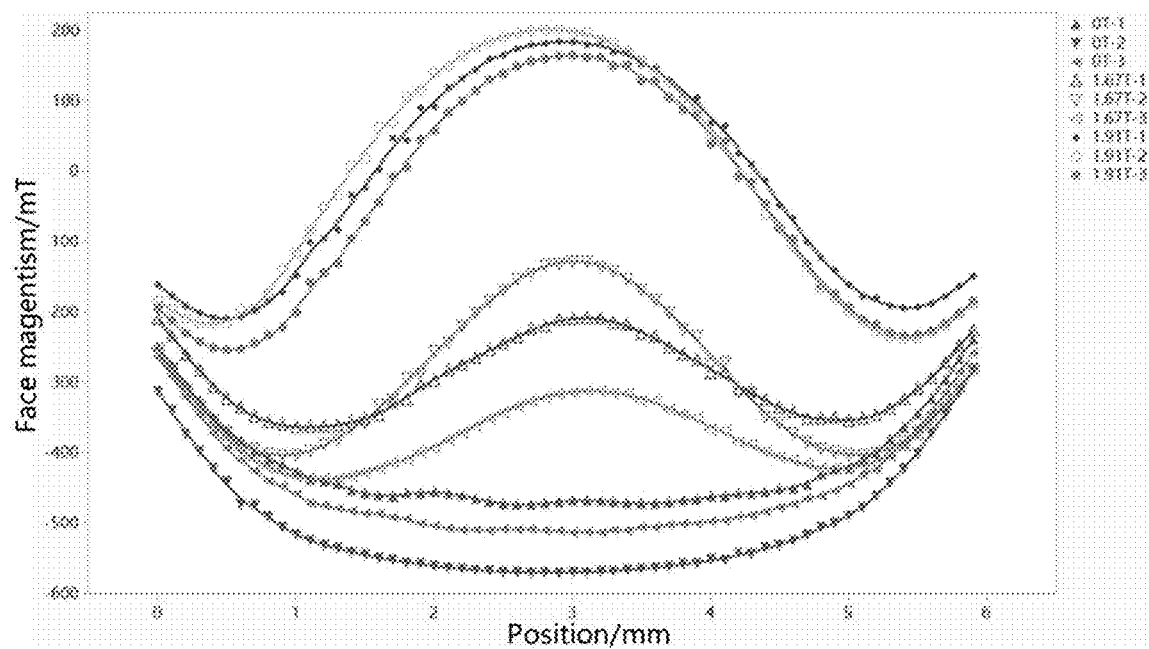
FIG. 7 is a face magnetogram of Sample 3 when being applied with reserve magnet fields having different intensities at three linear-scanning marker lines in Example 3.

Particular operation steps include:
1) selecting a grain boundary diffusion Sample 3 having a size of 20*15*6 mm, a size of diffusion faces, coated with heavy rare earth, that is, an upper face and a lower face, of 20*15 mm, a size of an orientation face (along an arrow direction, or a direction for applying the reverse magnetic field, which is perpendicular to the diffusion face of the heavy rare earth, or the diffusion direction) of 20*6 mm, and a size along the orientation direction of 15 mm, as shown in FIG. 4;

2) saturatedly magnetizing Sample 3, and observing magnetic field distribution characteristics of each of the faces under saturated magnetization at a detection window of Magview™;

3) applying a reserve magnetic field opposite to a direction for saturated magnetization to Sample 3, in which an intensity of the reserve magnetic field is 1.55 T, and observing magnetic field distribution characteristics of each of the faces of Sample 3 by the method in step 2);

4) saturatedly magnetizing Sample 3, applying the reserve magnetic field thereto for a second time, in which the intensity of the reserve magnetic field is 1.67 T, and observing the magnetic field distribution of Sample 3 by the method in step 2);

5) repeating step 4), in which the intensity of the reserve magnetic fields is 1.79 T, 1.91 T, 2.03 T, 2.15 T, and 2.27 T, respectively; and observing the magnetic field distribution characteristics of Sample 3 after each of the operations;

6) summarizing all the magnetic field distribution characteristics of Sample 3 in FIG. 5; and 7) linearly scanning Samples 3 applied with reverse magnetic field of 0T, 1.67 T, and 1.91 T, respectively, along positions (①)(②)(③) in FIG. 6 by using a space magnetic field distribution measuring instrument, according to figures showing summarized magnetic field distribution characteristics, in which, a distance between Sample 3 and a probe of the space magnetic field measuring instrument is 0.5 mm, with the result being shown in FIG. 7.

FIG. 5 obtained in the step 6) shows images obtained when Sample 3 is applied with no reserve magnetic field or applied with a reserve magnetic field having an intensity of 1.55 T, 1.67 T, 1.79 T, 1.91 T, 2.03 T or 2.27 T, respectively. Side1-side4 correspond to images of top face, bottom face, left face, and right face of Sample 3, and the fifth column and the sixth column show the images of two orientation faces, respectively.

It can be seen from FIG. 5 that, when the intensity of the applied reserved magnetic fields is 1.79 T, the number of magnetic poles of the four non-diffusion faces, that is, 1.79 T-3, 1.79 T-4, 1.79 T-N, and 1.79 T-S, starts to increase, and there is layered magnetic field distribution; and, when the intensity of the applied reserved magnetic fields is 1.91 T, the number and distribution of the magnetic poles of corresponding non-diffusion faces have been changed significantly. Therefore, Sample 3 has suffered from an irreversible demagnetization when the reserve magnetic field having an intensity of 1.79 T is applied.

It can be seen from FIG. 7 obtained in step 7), the results of surface magnetic field obtained by linearly scanning positions (①)(②)(③) show the same magnetic pole when the intensity of the applying reserve field is 1.67 T, while the results of surface magnetic field obtained by linearly scanning positions (①)(②)(③) show different magnetic poles when the intensity of the applying reserve field is increased to 1.91 T, and layered distribution of magnetic poles can be obtained from the fluctuation of the curves. It shows that, applying a reverse magnetic field having an intensity from 1.67 T to 1.91 T leading to increased number of magnetic poles and layered distribution of magnetic poles, showing that Sample 3 has suffered from an irreversible demagnetization during such process.

In summary, it can be seen from comparing FIG. 5 with FIG. 7 obtained in Example 3 that, both Magview™ and a space magnetic field distribution measuring instrument can be used for detecting whether there is irreversible demagnetization in Sample 3. The same detection results obtained by using the space magnetic field distribution measuring instrument in step 7) and by using Magview™ in step 6) confirm an accuracy of result judgement of Sample 3 by using the two instruments.

Figure 8:
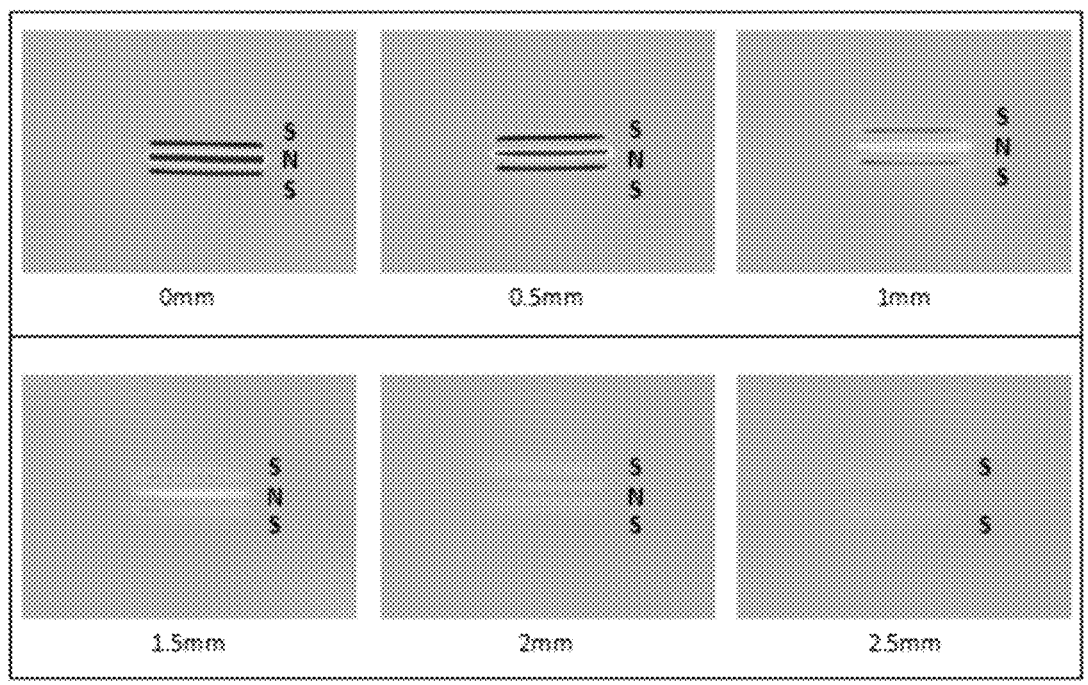
FIG. 8 is an image of magnetic field distribution of Sample 4 obtained when being detected at different heights from a surface of Sample 3.

Example 4 is a method for identifying an irreversible demagnetization of a grain boundary diffusion NdFeB magnet, differing from Example 3 in that: in step 3), Sample 3 is applied with a reserve magnetic field opposite to a direction for saturated magnetization and having an intensity of 1.91 T, and the sample is observed at a detection window of Magview™ with a distance between Sample 3 and the detection window being 0 mm, 0.5 mm, 1 mm, 1.5 mm, 2 mm and 2.5 mm, respectively. The magnetic field distribution characteristics of Sample 3 as obtained are summarized in FIG. 8.

It is shown that, there is a good detection result when the distance between Sample 3 and Magview™ detection window is 0-2.0 mm There is a tendency to obtain unclear magnetic field distribution when the gap is greater than 2.5 mm.

Example 5 is a method for identifying an irreversible demagnetization of a grain boundary diffusion NdFeB magnet, differing from Example 3 by performing detection by using a Gauss meter. Particular detection method is as follows.

Figure 9:
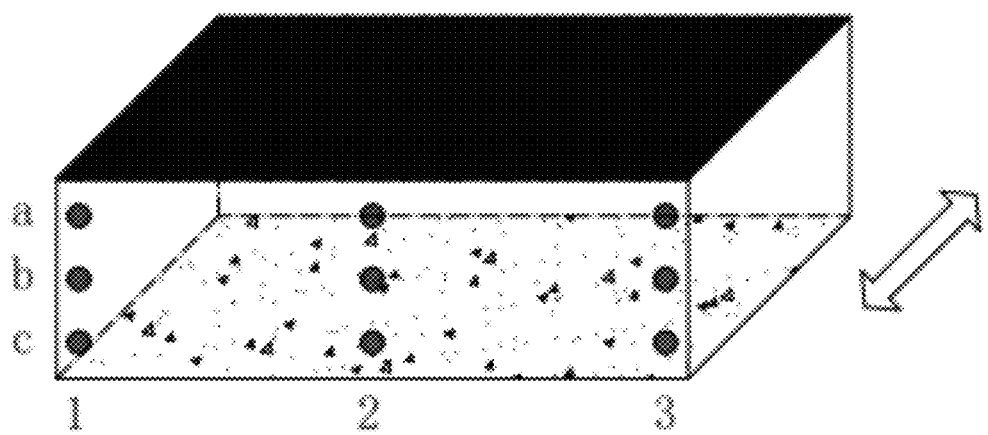
FIG. 9 is a schematic illustration of nine marker points and an orientation direction of magnets of Sample 3 and the Sample 4 in Example 5 and Example 6.

Sample 3 is equidistantly marked as shown in FIG. 9, and divided into three rows from top to bottom, in which marking points in a first row are a1, a2 and a3; marking points in a second row are b1, b2 and b3; and marking points in a third row are c1, c2 and c3.

Under conditions of saturated magnetization and applied magnetic field having an intensity of 1.67 T and 1.91 T, all the making points are detected by using the Gauss meter, and the results as obtained are shown in Table 2.

TABLE 2

| Change of surface magnetic field intensity at a1-a9 in Example 5 | | | | | | | | | |
|---|---|---|---|---|---|---|---|---|---|
| face magnetic field | detection point | | | | | | | | |
| reserve magnetic field | a1 | b1 | c1 | a2 | b2 | c2 | a3 | b3 | c3 |
| Saturation magnetization | −249.7 mT | −469 mT | −239.8 mT | −313.1 mT | −570.6 mT | −283.5 mT | −264.6 mT | −513.1 mT | −258.8 mT |
| 1.67T | −210.8 mT | −211.7 mT | −226.9 mT | −260 mT | −129.6 mT | −281.5 mT | −251.9 mT | −315 mT | −281.8 mT |
| 1.91T | −161.8 mT | 182.6 mT | −149.4 mT | −184.6 mT | 199.6 mT | −188.6 mT | −195 mT | 163.3 mT | −184.8 mT |

The detection here is performed on the same face, the detection result as obtained is a parameter of surface magnetic field intensity.

The detection under saturated magnetization, in which no reverse magnetic field is applied and there is no tendency to irreversible magnetization, is conducted for comparing with that conducted when a reserve magnetic field is applied.

When the intensity of the reserve magnetic field is increased to 1.91 T, there is a significant change at the b1, b2 and b3, showing an irreversible demagnetization in Sample 3 when the intensity of the reserve magnetic field is increased to 1.91 T.

In combination with Example 3, it can be concluded that, an irreversible magnetization can be directly determined from the results obtained by using either Magview™ or a Gauss meter.

Example 6 is a method for identifying an irreversible demagnetization of a grain boundary diffusion NdFeB magnet, differing from Example 3 by using Sample 4 having a size of 20*15*6 mm, a size of orientation faces of 20*6 mm, a size along the orientation direction of an average remanence of 12.52 kGs, and an average coercivity of 45.1 kOe, and using a magnetic-pole identifying pen as a detection instrument.

Sample 4 is equidistantly marked as shown in FIG. 9, and divided into three rows from top to bottom, in which marking points in a first row are a1, a2 and a3; marking points in a second row are b1, b2 and b3; and marking points in a third row are c1, c2 and c3.

After saturated magnetization and applying a reverse magnetic fields of 3.42 T and 3.91 T, respectively, the sample is detected at all the marking points by using a magnetic-pole identifying pen under the conditions in which corresponding magnetic fields are applied. The final test results are shown in Table 3 in details.

| Chart 3 Change of magnetic poles at a1-a9 in Example 6 | | | | | | | | | |
|---|---|---|---|---|---|---|---|---|---|
| magnetic pole | detection point | | | | | | | | |
| reserve magnetic field | a1 | b1 | c1 | a2 | b2 | c2 | a3 | b3 | c3 |
| Saturation magnetization | S | S | S | S | S | S | S | S | S |
| 3.42T | S | S | S | S | S | S | S | S | S |
| 3.91T | S | N | S | S | N | S | S | N | S |

As shown in above table, it can be seen that the magnetic poles on the detection face of the Sample 4 are S poles at the marking points under the saturated magnetization. The magnetic poles of the marked points are kept as the same polarity when the intensity of the applied reserve magnetic field is changed to 3.42 T; and all the magnetic poles at the b1, b2 and b3 marked points are changed to N poles, and there is a S/N/S change of magnetic poles at a1, b1, or c1 or all of a1, b1, and c1 when the intensity of the applied reserve magnetic field is 3.91 T. The results show that, when the applied reverse magnetic field is 3.9 T, there is a demagnetization for the magnetic poles at b due to the application of the reverse magnetic field having a specific value, so that the magnetic poles is changed from initial S pole to N pole.

Example 7 is a method for identifying an irreversible demagnetization of a grain boundary diffusion NdFeB magnet, differing from Example 3 by using Sample 5 having an average magnetic field intensity of 13.79 kGs, an average coercivity of 28.16 kOe, and parameters shown in Table 1.

Particular operation method include:
3) applying a reserve magnetic field opposite to a direction for saturated magnetization to Sample 5, in which an intensity of the reserve magnetic field is 2.77 T, and observing magnetic field distribution characteristics of each of the faces of Sample 5 at the detection window of Magview™;
4) saturatedly magnetizing Sample 5, applying the reserve magnetic field thereto for a second time, in which the intensity of the reserve magnetic field is 2.51 T, and observing the magnetic field distribution of Sample 5 by the method in step 3);
5) repeating step 4), in which the intensity of the reserve magnetic fields is 2.75 T; and
6) summarizing all the magnetic field distribution characteristics of Sample 5 in FIG.

Figure 10:
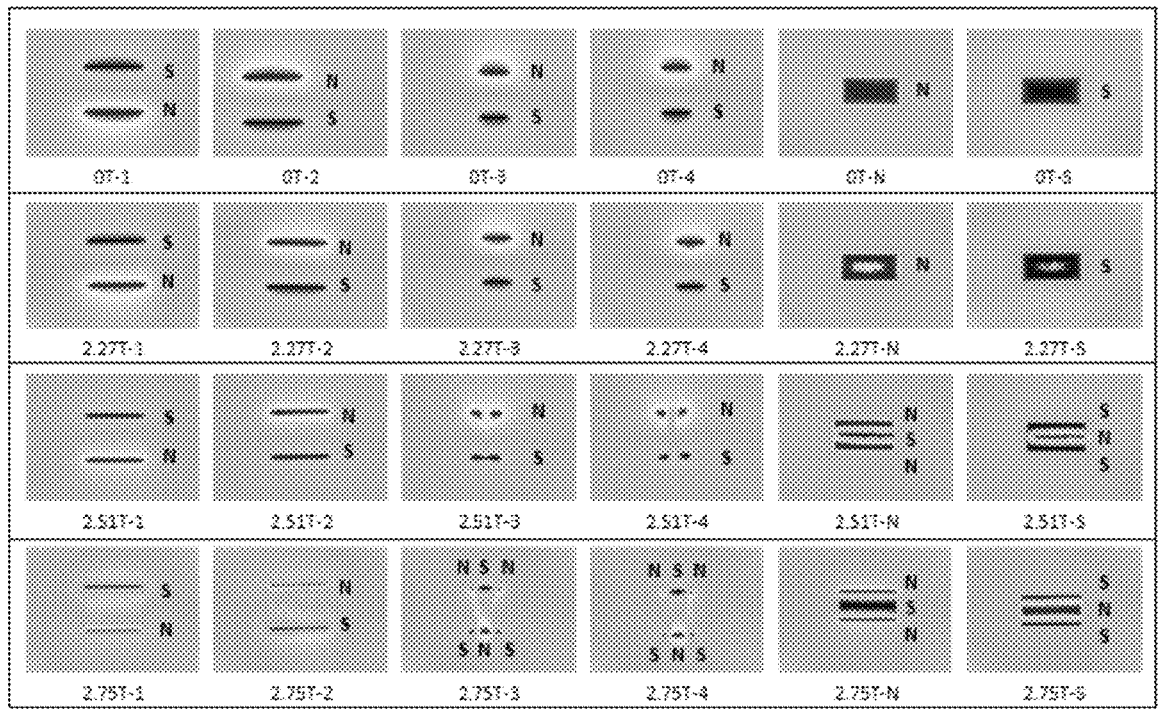
FIG. 10 is an image of magnetic field distribution of Sample 5 in Example 7 obtained when being applied with reserve magnet fields having different intensities.

It can be seen from FIG. 10 that, when the intensity of the reverse magnetic field is 2.27 T, the number and distribution of the magnetic poles has been changed in the images for 2.27 T-N and 2.27 T-S; and, further, when the intensity of the reserve magnetic field is 2.27 T, the number and distribution of the magnetic poles in corresponding images are more obvious and significant. The results show that, there is a demagnetization in Sample 5 when the reverse magnetic field is applied is 2.27 T.

Example 8 is a method for identifying an irreversible demagnetization of a grain boundary diffusion NdFeB magnet, differing from example 2 by using a magnetic developing film as the detection device. Particular operation steps include:
1) saturatedly magnetizing Sample 2, applying a reserve magnetic field opposite to the direction of saturated magnetization, in which the intensity of the reserve magnetic field is 1.79 T; and
2) placing the magnetic developing film on Sample 2, and observing the magnetic field distribution characteristics of six faces of Sample 2 under such state, which is shown in FIG. 11 in details.

Figure 11:
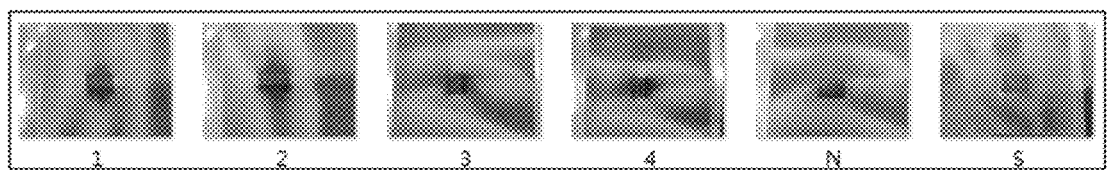
FIG. 11 is an image of magnetic field distribution of Sample 2 in Example 8 detected using a magnetic developing film.

It can be seen from FIG. 11 that, four distributions of magnetic poles are shown in the magnetic developing film when the intensity of the applied reserve magnetic field is 1.79 T, while only two distributions of magnetic poles are observed under the saturated magnetization.

In combination with figures for Example 2, it can be found that, the number of the magnetic poles has been increased significantly and the distribution of the magnetic poles is changed significantly when the intensity of the reserve magnetic field is 1.79 T.

Therefore, the above result shows that the demagnetization of Sample 2 can be detected by the distribution of magnetic poles by using the magnetic developing film.

Example 9 is a method for identifying an irreversible demagnetization of a grain boundary diffusion NdFeB magnet, differing from Example 3 by the following operation method: saturatedly magnetizing Sample 3, incubating in an 80° C. oven for 10 min, applying a reserve magnetic field opposite to the direction for saturated magnetization, in which the intensity of the reserve magnetic field is 1.31 T, removing Sample 3 from the oven, cooling down to a room temperature, and observing the magnetic field distribution characteristics of each of faces of Sample 3 under such state Sample 3 at a detection window of Magview™.

The above steps are repeated, in which the intensity of the reserve magnetic field is adjusted to 1.43 T, 1.55 T and 1.67 T, respectively; and the magnetic field characteristics of Sample 3 is observed after each of the operations.

Figure 12:
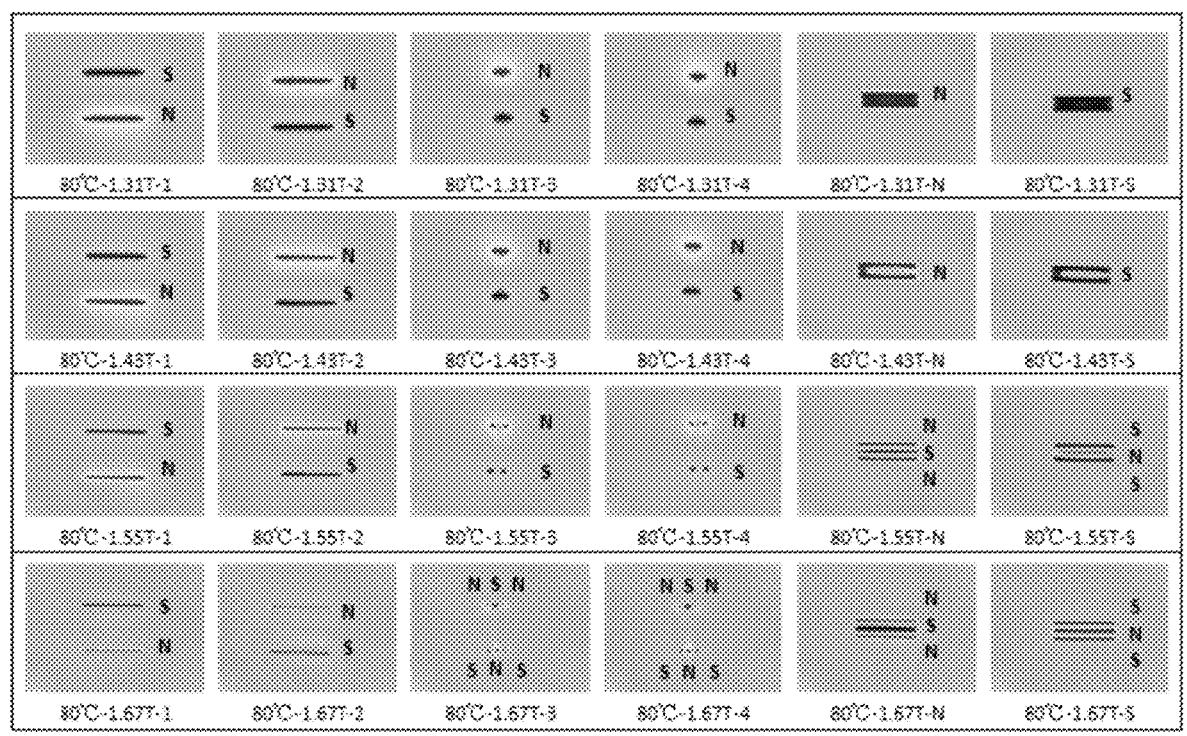
FIG. 12 is an image of magnetic field distribution of Sample 3 subjected to a high temperature treatment in Example 9 when being applied with reserve magnet fields having different intensities.

All the magnetic field characteristic distributions of Sample 3 are summarized in FIG. 12.

In FIG. 5 for Example 3, before the reserve magnetic field is applied, Sample 3 is at a room temperature, and the number of the magnetic poles is increased and the distribution of magnetic pole distributions is changed when the intensity of the applied reserve magnetic field is 1.67 T.

It can be seen in combination with FIG. 12 that, when Sample 3 is treated at a relatively high temperature of 80° C. before the reserve magnetic field is applied, the number of the magnetic poles can be found increased and the distribution of magnetic poles can be found changed when the intensity of the reserve magnetic field is 1.55 T; and, with the gradual increase of the reverse magnetic field, increase in number of the magnetic poles and layering of magnetic poles become more obvious.

In summary, the above results that, the method of the present application is not only applicable to a grain boundary diffusion NdFeB magnet sample at a room temperature, but also applicable to a grain boundary diffusion NdFeB magnet sample treated at a relatively high temperature treatment and applied with a high reverse magnetic field; and, in contrast, the number and distribution of magnetic poles can be observed at a relatively low intensity of a reverse magnetic field for a magnet sample treated at a relatively high temperature followed by a reverse magnetization, which shows that, a magnet working at a relatively high temperature can also be identified in terms of demagnetization by using a method of the present application.

COMPARATIVE EXAMPLE

Comparative Example 1 is a method for detecting a magnet, differing from the Example 1 by using Sample 6, which is non-grain boundary diffusion magnet, that is, Model N52SH, and has a size of 20*15*6 mm, a size of an orientation face of 20*15 mm, a size along an orientation direction of 6 mm (the orientation direction is in a line with a diffusion direction), an average remanence of 14.32 kGs, and an average coercivity of 19.03 kOe.

Figure 13:
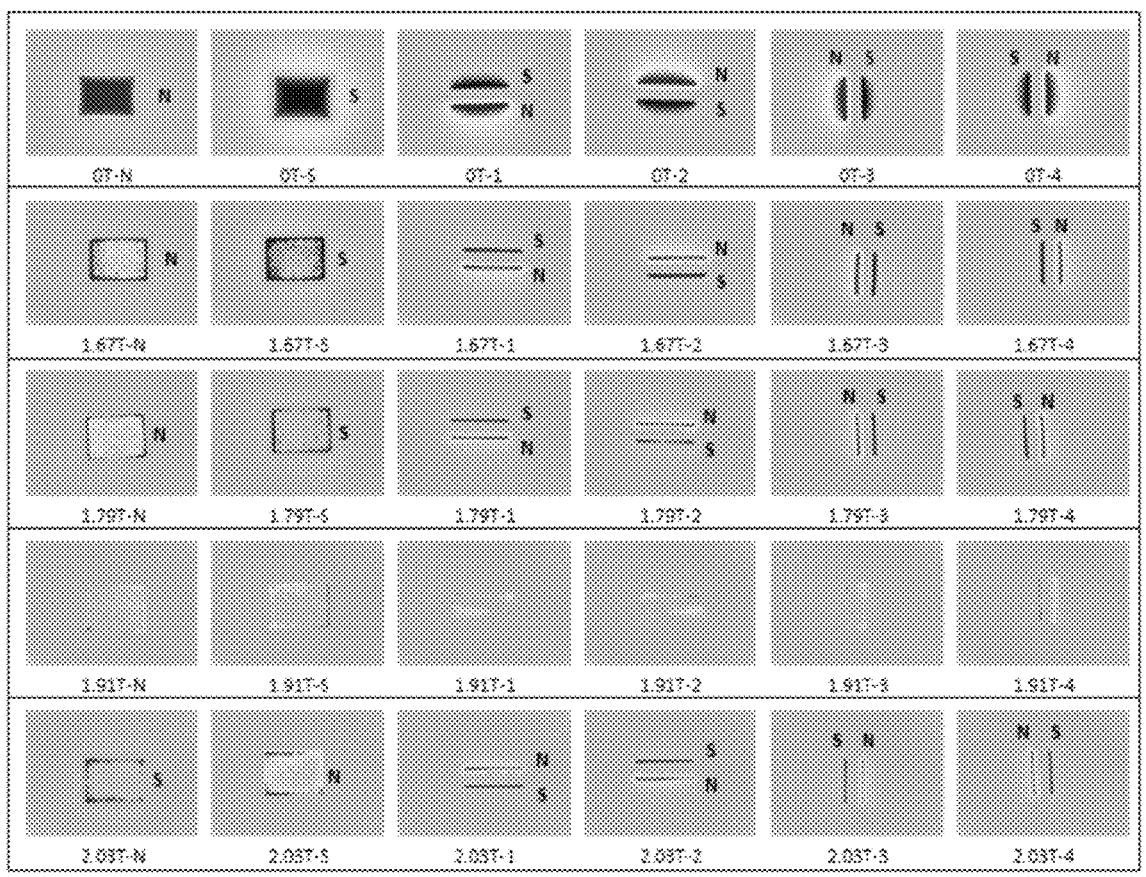
FIG. 13 is an image of magnetic field distribution of Sample 6 (amorphous boundary diffusion NdFeB magnet) in Comparative Example 1 when being applied with reserve magnet fields having different intensities.

Particular operation steps include:
1) saturately magnetizing Sample 6, and observing magnetic field distribution characteristics of each of faces of the Sample 6 at a detection window of Magview™;
2) applying a reserve magnetic field opposite to the direction for saturated magnetization to Sample 6, in which the intensity of the reserve magnetic field is 1.67 T, and observing the magnetic field distribution characteristics of each of faced of Sample 6 under such state by the method in step 1);
3) saturately magnetizing Sample 6, applying the reserve magnetic field for a second time, in which the intensity of the reserve magnetic field is 1.79 T, and observing the magnetic field distribution characteristics of Sample 6 under such state by the method in the step 1);
4) repeating step 3), in which the intensity of the reserve magnetic field is 1.91 T and 2.03 T, respectively; and observing the magnetic field distribution characteristic of Sample 6 after each of the operations; and
5) summarizing all magnetic field characteristics of the Sample 6 in FIG. 13.

It can be seen in combination with FIG. 13 that, although there is an increase in the number of magnetic poles and coexistance of the N poles and the S poles in 1.91 T-N, 1.91 T-S, 1.91 T-1, 1.91 T-2, 1.91 T-3 and 1.91 T-4, there is no layering; and, with the increase of the intensity of the applied reserve magnetic field, there is no increase in the number of magnetic poles and layering of magnetic poles, which shows that, the method of the present application is only applicable for observing whether there is an irreversible demagnetization in a grain boundary diffusion NdFeB magnet, failing to obtain a result on whether there is an irreversible demagnetization in a non-gain boundary diffusion NdFeB magnet.

The detailed examples are only an explanation for the present application, not imposing any limitation to the present application, and those skilled in the art may do uncreative modifies according to needing after reading the specification of the present application, but which should be protected by patent law within scope of the present claims.

What is claimed is:

1. A method for identifying an irreversible demagnetization of a grain boundary diffusion NdFeB magnet, comprising applying a reverse magnetic field to a saturatedly magnetized grain boundary diffusion NdFeB magnet, and, when a number of magnetic poles on a non-diffusion face of the grain boundary diffusion NdFeB magnet is increased and divided into layers, determining that there is an irreversible demagnetization in the grain boundary diffusion NdFeB magnet.

2. The method for identifying an irreversible demagnetization of a grain boundary diffusion NdFeB magnet according to claim 1, comprising:
saturatedly magnetizing the grain boundary diffusion NdFeB magnet, applying the reverse magnetic field, and analyzing a value of the reverse magnetic field, the number of the magnetic poles, and a distribution of the magnetic poles in the reverse magnetic field.

3. The method for identifying an irreversible demagnetization of a grain boundary diffusion NdFeB magnet according to claim 1, wherein, determining that there is an irreversible demagnetization in the grain boundary diffusion NdFeB magnet when a diffusion direction is parallel to an orientation direction of the grain boundary diffusion NdFeB magnet, and the number of the magnetic poles appearing on a non-orientation face is increased and divided into layers.

4. The method for identifying an irreversible demagnetization of a grain boundary diffusion NdFeB magnet according to claim 3, wherein, when the diffusion direction is parallel to the orientation direction of the grain boundary diffusion NdFeB magnet, and the number of the magnetic poles appearing on a non-orientation surface is increased and divided into layers, there is an alternative magnetic pole distribution N/S/N/S.

5. The method for identifying an irreversible demagnetization of a grain boundary diffusion NdFeB magnet according to claim 3, wherein, a heavy rare earth element is coated on an orientation surface of the grain boundary diffusion NdFeB magnet, wherein the orientation surface is one selected from a group consisting of N pole face and S pole face of the grain boundary diffusion NdFeB magnet.

6. The method for identifying an irreversible demagnetization of a grain boundary diffusion NdFeB magnet according to claim 4, wherein, a heavy rare earth element is coated on an orientation surface of the grain boundary diffusion NdFeB magnet, wherein the orientation surface is one selected from a group consisting of N pole face and S pole face of the grain boundary diffusion NdFeB magnet.

7. The method for identifying an irreversible demagnetization of a grain boundary diffusion NdFeB magnet according to claim 1, wherein, determining that there is an irreversible demagnetization in the grain boundary diffusion NdFeB magnet when a diffusion direction is perpendicular to an orientation of the grain boundary diffusion NdFeB magnet, and the number of the magnetic poles appearing on an orientation surface is increased and divided into layers.

8. The method for identifying an irreversible demagnetization of a grain boundary diffusion NdFeB magnet according to claim 7, wherein, when the diffusion direction is parallel to an orientation direction of the grain boundary diffusion NdFeB magnet, and the number of the magnetic poles appearing on a non-orientation surface is increased and divided into layers, there is an alternative magnetic pole distribution N/S/N or S/N/S.

9. The method for identifying an irreversible demagnetization of a grain boundary diffusion NdFeB magnet according to claim 7, wherein, a heavy rare earth element is coated on a non-orientation surface of the grain boundary diffusion NdFeB magnet, wherein the non-orientation surface is one of a group of parallel faces other than a N pole face and a S pole face of the grain boundary diffusion NdFeB magnet.

10. The method for identifying an irreversible demagnetization of a grain boundary diffusion NdFeB magnet according to claim 8, wherein, a heavy rare earth element is coated on the non-orientation surface of the grain boundary diffusion NdFeB magnet, wherein the non-orientation surface is one of a group of parallel faces other than a N pole face and a S pole face of the grain boundary diffusion NdFeB magnet.

11. The method for identifying an irreversible demagnetization of a grain boundary diffusion NdFeB magnet according to claim 1, wherein, a device used for identifying a magnetic field distribution characteristic, the device comprising any one selected from a group consisting of a magnetic field distribution visualization device, a spatial magnetic field distribution measuring instrument, a Gauss meter, a magnetic developing film or a magnetic-pole identifying pen.

12. The method for identifying an irreversible demagnetization of a grain boundary diffusion NdFeB magnet according to claim 1, wherein, a temperature of the saturatedly magnetized grain boundary diffusion NdFeB magnet is no less than 20° C.; and a size of the grain boundary diffusion NdFeB magnet along a diffusion orientation is no greater than 12 mm.

13. The method for identifying an irreversible demagnetization of a grain boundary diffusion NdFeB magnet according to claim 1, wherein, a value of the reverse magnetic field applied on the grain boundary diffusion NdFeB magnet is less than a coercivity of the grain boundary diffusion NdFeB magnet.

\* \* \* \* \*